(12) United States Patent
Fujiwara et al.

(10) Patent No.: US 7,928,551 B2
(45) Date of Patent: Apr. 19, 2011

(54) SEMICONDUCTOR DEVICE AND METHOD OF MANUFACTURING THE SAME

(75) Inventors: Reiko Fujiwara, Tokyo (JP); Akihiko Hatasawa, Tokyo (JP); Fumitomo Watanabe, Tokyo (JP)

(73) Assignee: Elpida Memory, Inc., Chuo-ku, Tokyo (JP)

( * ) Notice: Subject to any disclaimer, the term of this patent is extended or adjusted under 35 U.S.C. 154(b) by 274 days.

(21) Appl. No.: 12/285,832

(22) Filed: Oct. 15, 2008

(65) Prior Publication Data

US 2009/0096111 A1 Apr. 16, 2009

(30) Foreign Application Priority Data

Oct. 16, 2007 (JP) .................. 2007-268504

(51) Int. Cl.
*H01L 23/02* (2006.01)
(52) U.S. Cl. ............... 257/686; 257/777; 257/E25.006; 257/E25.013; 257/E25.021; 257/E25.027; 257/E23.085
(58) Field of Classification Search ............... 257/686, 257/777, E25.006, E25.013, E25.021, E25.027, 257/E23.085; 438/109, FOR. 426
See application file for complete search history.

(56) References Cited

U.S. PATENT DOCUMENTS

| 6,353,263 | B1 | 3/2002 | Dotta et al. |
| 2005/0156323 | A1 | 7/2005 | Tokunaga |
| 2007/0182021 | A1* | 8/2007 | Bauer et al. .................... 257/778 |
| 2009/0057864 | A1* | 3/2009 | Choi et al. .................... 257/686 |

FOREIGN PATENT DOCUMENTS

| JP | 2000-299431 | 10/2000 |
| JP | 2002-261233 | 9/2002 |
| JP | 2005-197491 | 7/2005 |

* cited by examiner

*Primary Examiner* — Jasmine J Clark

(74) *Attorney, Agent, or Firm* — McGinn IP Law Group, PLLC

(57) ABSTRACT

In a semiconductor device, a first semiconductor chip is stacked on a wiring substrate and has first electrode pads disposed at predetermined positions on an upper surface thereof. A second semiconductor chip is stacked on the first semiconductor chip through an insulating member in an offset manner so that the first electrode pads are exposed. Support members support a back surface of a protruding portion of the second semiconductor chip through the insulating member.

19 Claims, 5 Drawing Sheets

SEMICONDUCTOR DEVICE AND METHOD OF MANUFACTURING THE SAME

This application is based upon and claims the benefit of priority from Japanese Patent Application No. 2007-268504, filed on Oct. 16, 2007, the disclosure of which is incorporated herein in its entirety by reference.

BACKGROUND OF THE INVENTION:

1. Field of the Invention

This invention relates to a semiconductor device having a wiring substrate and a plurality of semiconductor chips stacked thereon and further relates to a method of manufacturing such a semiconductor device.

2. Description of the Related Art

In recent years, following the reduction in size and thickness, the increase in capacity, and so on of semiconductor devices, it has become necessary to stack semiconductor chips in multi-stages and thus the reduction in thickness of semiconductor chips has been advanced. A related semiconductor device is described, for example, in Japanese Unexamined Patent Application Publication (JP-A) No. 2002-261233 (Patent Document 1). This semiconductor device is configured such that a lower-side semiconductor chip is mounted on a wiring substrate and an upper-side semiconductor chip is mounted on the lower-side semiconductor chip through a spacer.

However, in the case where an electrode pad is disposed at a portion, whose lower surface is not supported, of the upper-side semiconductor chip as in the semiconductor device described in Patent Document 1, there has been a problem that the upper-side semiconductor chip is broken due to pressure contact of a bonding tool when wire-bonding the electrode pad.

In view of this, as a technique for wire-bonding an electrode pad provided at a protruding portion of a semiconductor chip as described above, there has been proposed, for example, Japanese Unexamined Patent Application Publication (JP-A) No. 2000-299431 (Patent Document 2) or Japanese Unexamined Patent Application Publication (JP-A) No. 2005-197491 (Patent Document 3). Patent Document 2 or 3 is only applicable to the case where an upper-side semiconductor chip stacked on a lower-side semiconductor chip disposed on a wiring substrate has a chip size greater than that of the lower-side semiconductor chip.

Specifically, a semiconductor device described in Patent Document 2 is configured such that when flip-chip bonding a lower-side semiconductor chip to a wiring substrate through an anisotropic conductive adhesive, part of the adhesive is forced out from under the lower-side semiconductor chip to form a support portion by the forced-out adhesive and an upper-side semiconductor chip is mounted on the support portion and the lower-side semiconductor chip.

However, in the semiconductor device described in Patent Document 2, since the adhesive is forced out around the lower-side semiconductor chip to form the support portion by the forced-out adhesive, the amount of the adhesive increases for ensuring the height of the support portion. Therefore, there is a possibility that the adhesive spreads toward the outer edge of the wiring substrate to cover connection pads of the wiring substrate to be connected to the upper-side semiconductor chip. Further, since it is configured that the upper-side semiconductor chip is mounted on the back surface of the flip-chip mounted lower-side semiconductor chip and the support portion provided on the wiring substrate around the lower-side semiconductor chip, it is difficult to apply the configuration of Patent Document 2 to a semiconductor chip mounted in a third or subsequent stage.

On the other hand, a semiconductor device described in Patent Document 3 is configured such that a lower-side semiconductor chip is flip-chip bonded to a wiring substrate and an upper-side semiconductor chip is stacked on the lower-side semiconductor chip, wherein the upper-side semiconductor chip has a protruding portion protruding from the outer edge of the lower-side semiconductor chip and a convex support portion is provided on the surface of the wiring substrate, thereby supporting the protruding portion of the upper-side semiconductor chip by the support portion.

However, in the semiconductor device described in Patent Document 3, since it is configured that the support portion is provided on the surface of the wiring substrate, it is difficult to apply the configuration of Patent Document 3 to a semiconductor chip mounted in a third or subsequent stage. For example, if attempting to apply the configuration to the third-stage semiconductor chip, it is necessary to provide a support portion on the wiring substrate around the second-stage semiconductor chip so that the package size increases. Further, it is also necessary to increase the height of the support portion for the third-stage semiconductor chip and thus the package thickness also increases. Further, the chip size of the third-stage semiconductor chip is subjected to a limitation by the distance between the outer edge of the second-stage semiconductor chip and the support portion for the third-stage semiconductor chip. Further, since it is configured that the support portion is formed on the surface of the wiring substrate to directly support the upper-side semiconductor chip, there is a possibility of occurrence of a difference in height between the lower-side semiconductor chip and the support portion and, if the upper-side semiconductor chip is thin enough, there is even a possibility of occurrence of a crack therein due to this difference in height.

SUMMARY

Patent Document 2 or 3 is, as described before, only applicable to the case where the upper-side semiconductor chip stacked on the lower-side semiconductor chip disposed on the wiring substrate has a chip size greater than that of the lower-side semiconductor chip, and discloses nothing about, for example, the case where a lower-side semiconductor chip and an upper-side semiconductor chip have the same chip size and the upper-side semiconductor chip is disposed in an offset manner so that electrode pads arranged on an upper surface of the lower-side semiconductor chip are exposed. Further, with the configuration of Patent Document 2 or 3, it is difficult to stack a semiconductor chip in a third or subsequent stage without increasing the package size.

The present invention seeks to solve one or more of the above problems, or to improve upon those problems at least in part.

In one embodiment, there is provided a semiconductor device including:

a first semiconductor chip stacked on a wiring substrate and having first electrode pads disposed at predetermined positions on an upper surface thereof;

a second semiconductor chip stacked on the first semiconductor chip through an insulating member in an offset manner so that the first electrode pads are exposed; and support members supporting a back surface of a protruding portion of the second semiconductor chip through the insulating member.

BRIEF DESCRIPTION OF THE DRAWING

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Exemplary Embodiment

At first, a semiconductor device according to a first exemplary embodiment of this invention will be described with reference to the drawings.

Figure 1:
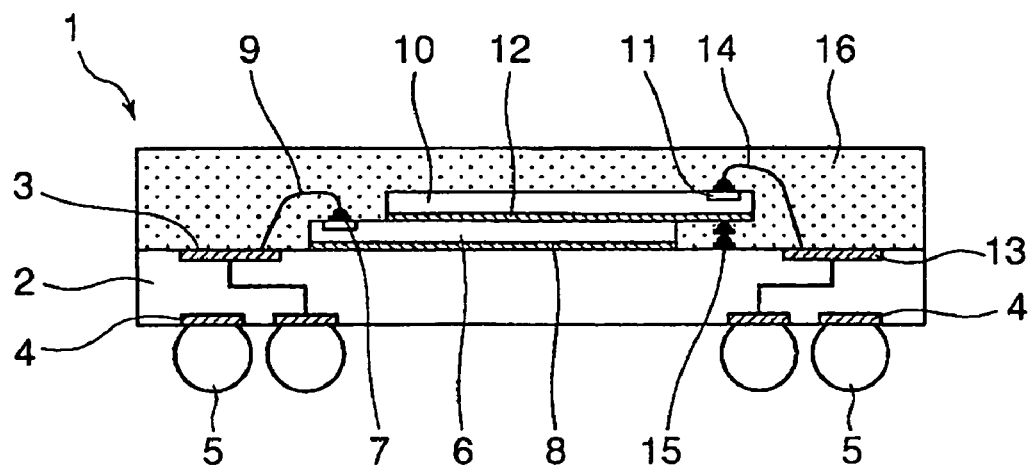
FIG. 1 is a sectional view illustrating a semiconductor device of a first exemplary embodiment according to this invention.
Figure 2:
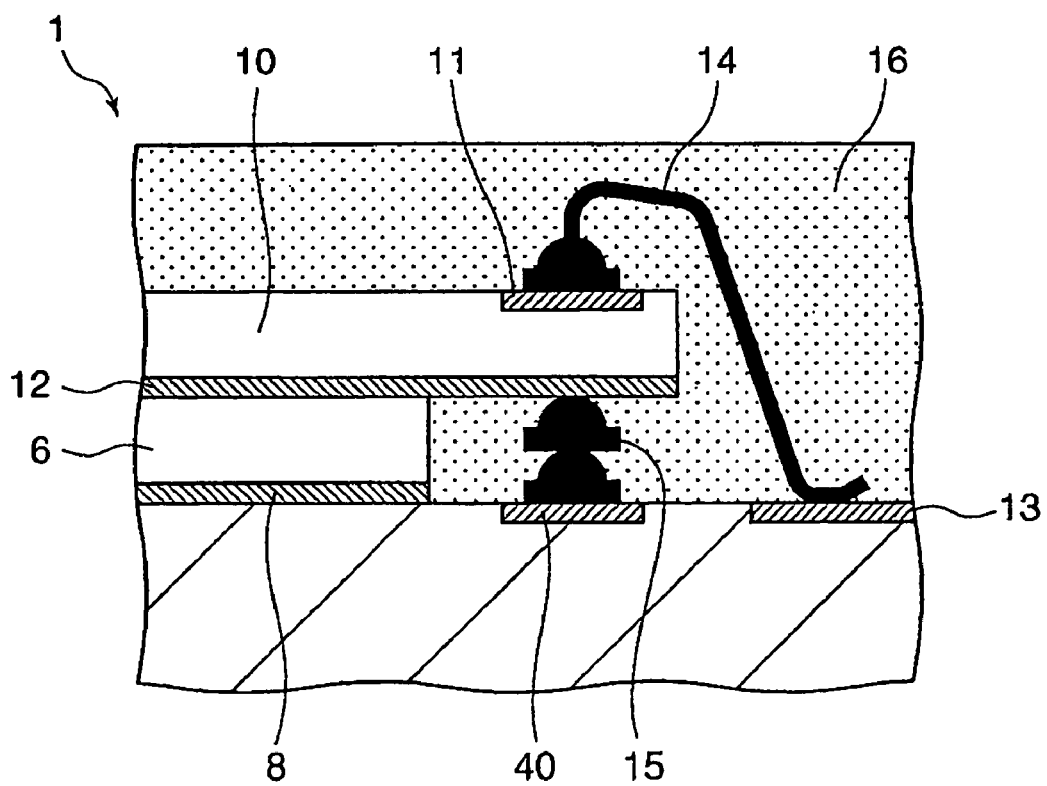
FIG. 2 is an enlarged view of the main part of the semiconductor device of the first exemplary embodiment according to this invention.

FIG. 1 is a sectional view illustrating the semiconductor device of the first exemplary embodiment, FIG. 2 is an enlarged view of the main part of the semiconductor device of the first exemplary embodiment, and FIGS. 3A to 3F are sectional views illustrating manufacturing processes of semiconductor devices of the first exemplary embodiment.

As illustrated in FIG. 1, the semiconductor device, generally depicted by numeral 1, of the first exemplary embodiment comprises a wiring substrate 2 having a generally square plate shape and formed with predetermined wiring patterns. The wiring substrate 2 is, for example, a glass epoxy substrate with a thickness of 0.25 mm and is formed with the wiring patterns on both surfaces thereof. A plurality of connection pads 3 and 13 are formed on one surface of the wiring substrate 2 near the outer edge thereof. A plurality of lands 4 are arranged in a lattice shape on the other surface of the wiring substrate 2. Further, external terminals (bump electrodes) 5 are mounted on the lands 4, respectively.

At a substantially central portion of the one surface of the wiring substrate 2, there is mounted a first (lower-side) semiconductor chip 6 having a generally square plate shape and formed with a predetermined circuit on one surface thereof. A plurality of electrode pads 7 are disposed only at one side of the one surface of the first semiconductor chip 6. The thickness of the first semiconductor chip 6 is, for example, as thin as about 30 to 50 μm. The other surface of the first semiconductor chip 6 is fixedly bonded to the wiring substrate 2 by a bonding member 8 having an adhesive layer on each of both surfaces of an insulating sheet member. The bonding member 8 has a thickness of, for example, about 10 to 20 μm. The electrode pads 7 are electrically connected to the corresponding connection pads 3 of the wiring substrate 2 through wires 9, respectively, each made of a conductive material such as, for example, Au.

As illustrated in FIGS. 1 and 2, a second (upper-side) semiconductor chip 10 is mounted at a portion above the first semiconductor chip 6. The second semiconductor chip 10 is the same chip as the first semiconductor chip 6 and is likewise disposed with a plurality of electrode pads 11 only at one side of one surface thereof.

In this manner, the first semiconductor chip 6 and the second semiconductor chip 10 have the same chip size.

The other surface of the second semiconductor chip 10 is likewise fixedly bonded to the first semiconductor chip 6 by a bonding member 12 having an adhesive layer on each of both surfaces of an insulating sheet member. The second semiconductor chip 10 is disposed above the first semiconductor chip 6 in an offset manner so as not to overlap with the electrode pads 7 of the first semiconductor chip 6.

In the semiconductor device 1 of the first exemplary embodiment, the electrode pads 11 of the second semiconductor chip 10 are disposed at the side opposite to the side where the electrode pads 7 of the first semiconductor chip 6 are disposed. With this configuration, it becomes possible to achieve space saving when stacking semiconductor chips in multi-stages. The electrode pads 11 are electrically connected to the corresponding connection pads 13 of the wiring substrate 2 through wires 14, respectively, each made of a conductive material such as, for example, Au.

Further, in an area not overlapping with the first semiconductor chip 6, there are provided support members 15 supporting the other surface of a portion, where the electrode pads 11 are disposed, of the second semiconductor chip 10. Herein, bumps stacked in two tiers, i.e. a two-tier bump, is used as each of the support members 15 because there is no need to prepare new members. Each support member 15 has a shape of, for example, a circular cylinder or a circular cone. Each support member 15 is formed by stacking bumps each having a height of about 30 μm, thereby obtaining a total height of, for example, about 40 to 60 μm.

It is configured that each support member 15 supports the other surface of the second semiconductor chip 10 at its portion corresponding to the electrode pad 11 through the bonding member 12 serving as an insulating member. As described above, the bonding member 12 as the insulating member has the adhesive layers on both surfaces of the insulating sheet member. Accordingly, since the bonding member 12 as the insulating member serves as a buffering member, it is configured that the support members 15 do not directly support the second semiconductor chip 10. Therefore, it is possible to reduce occurrence of a chip crack caused by contact between the support members 15 and the second semiconductor chip 10. Herein, the support members 15 are formed, for example, on connection pads 40 arranged on the wiring substrate 2.

It is preferable that each support member 15 support the portion, corresponding to the electrode pad 11, of the second semiconductor chip 10. However, in consideration of the flowability of a resin in a molding process, it is also possible to configure that each support member 15 supports a portion between the two electrode pads 11 and, with this configuration, it is possible to widen the arrangement interval of the support members 15. Further, a sealing body 16 is formed on the wiring substrate 2 so as to cover the first semiconductor chip 6 and the second semiconductor chip 10.

Referring now to FIGS. 3A to 3F, a manufacturing method of the semiconductor device 1 according to the first exemplary embodiment will be described also using FIG. 1.

Figure 3A:
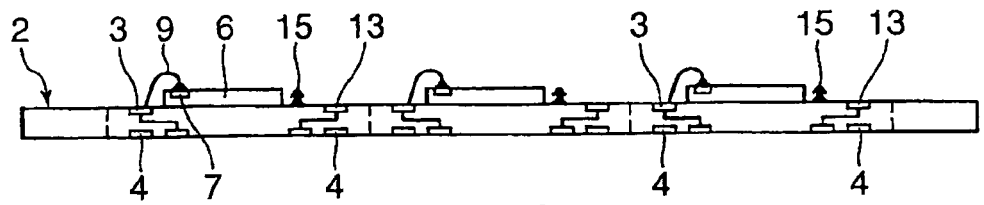
FIGS. 3A to 3F are sectional views illustrating manufacturing processes of semiconductor devices of the first exemplary embodiment according to this invention.

At first, a wiring substrate 2 as illustrated in FIG. 3A is prepared. Then, first semiconductor chips 6 each having a bonding member 8 bonded on its back surface are mounted on the wiring substrate 2. Then, electrode pads 7 of the first semiconductor chips 6 and connection pads 3 of the wiring substrate 2 are electrically connected together through wires 9, respectively.

Specifically, each wire 9 is made of, for example, Au and, using a non-illustrated wire bonding apparatus, the wire 9 melted and formed with a ball at its tip is bonded to the electrode pad 7 of the first semiconductor chip 6 by ultrasonic thermocompression bonding and, thereafter, a predetermined loop is described and a rear end of the wire 9 is bonded to the corresponding connection pad 3 by ultrasonic thermocompression bonding, thereby achieving electrical connection between the pads.

Further, support members 15 are formed at predetermined positions on the wiring substrate 2, i.e., herein, at positions supporting the back surfaces of second semiconductor chips 10 at their portions where electrode pads 11 are disposed. Each support member 15 is formed, for example, by bonding a conductive wire melted and formed with a ball at its tip to the wiring substrate 2 by ultrasonic thermocompression bonding, then clamping to tear off the wire to form a first bump, and then forming a second bump on the first bump in the same manner, thereby forming a two-tier bump serving as the support member 15. The height of the stacked two-tier bump is set slightly greater than the thickness of the first semiconductor chip 6.

Each support member 15 may be provided at a position near but offset from the electrode pad 11, i.e. at a position not just under the electrode pad 11. Alternatively, the support members 15 may be arranged at a predetermined interval, i.e. not corresponding to all the electrode pads 11 disposed in an area not overlapping with the first semiconductor chip 6.

Figure 3B:
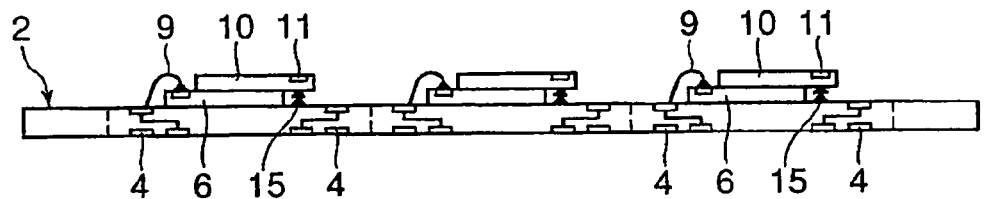

Then, as illustrated in FIG. 3B, the second semiconductor chips 10 each having a bonding member 12 bonded on its back surface are stacked on the first semiconductor chips 6 mounted on the wiring substrate 2. In this event, the stacked two-tier bumps as the support members 15 each formed slightly higher than the first semiconductor chip 6 are leveled to a proper height by the back surfaces of the second semiconductor chips 10. In this manner, the back surface of each second semiconductor chip 10 is supported by the support members 15 through the bonding member 12 as an insulating member.

In this first exemplary embodiment, it is configured that the leveling of the stacked two-tier bumps as the support members 15 is carried out by the stacking of the second semiconductor chips 10. However, it may alternatively be configured that the leveling is carried out after the formation of the stacked two-tier bumps on the wiring substrate 2 but before the stacking of the second semiconductor chips 10.

Figure 3C:
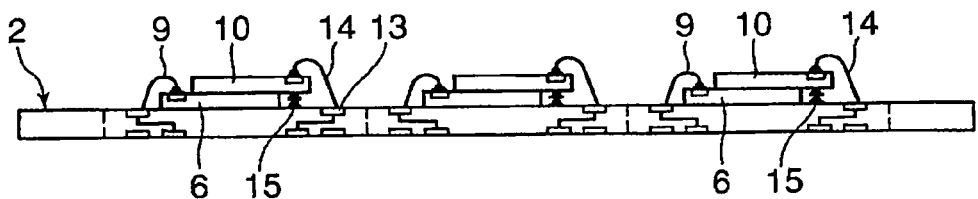

Thereafter, as illustrated in FIG. 3C, the electrode pads 11 of the second semiconductor chips 10 and connection pads 13 of the wiring substrate 2 are electrically connected together by wires 14, respectively. The wires 14 are wire-bonded in the same manner as the wires 9. In this first exemplary embodiment, since it is configured that each support member 15 supports the second semiconductor chip 10 at its portion corresponding to the electrode pad 11 through the bonding member 12 as the insulating member, the wire bonding can be achieved satisfactorily.

Figure 3D:
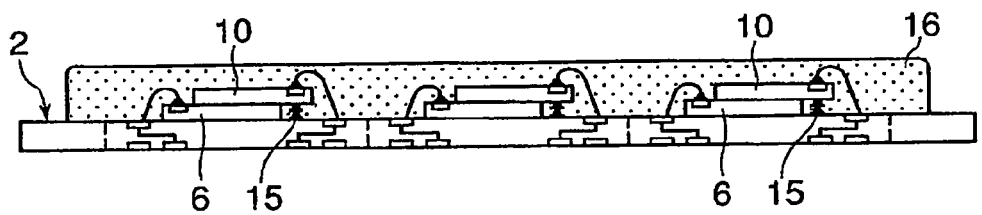

Then, as illustrated in FIG. 3D, a sealing body 16 is formed over one surface of the wiring substrate 2 by molding. The sealing body 16 is formed, for example, by clamping the wiring substrate 2 between upper and lower dies of a molding die assembly in a transfer molding apparatus (not illustrated), then introducing, under pressure, a thermosetting epoxy resin from a gate into a cavity formed by the upper and lower dies to fill the cavity with the resin, and then heat-curing it. The support members 15 provided on the wiring substrate 2 are each as small as about 30 μm and each have a circular cylinder shape or a circular cone shape and, therefore, it is possible to satisfactorily perform the sealing without impeding the flow of the resin. In this event, by causing the resin to flow in a direction perpendicular to the offset direction of the stacked second semiconductor chips 10, the flowability of the resin can be further improved.

Figure 3E:
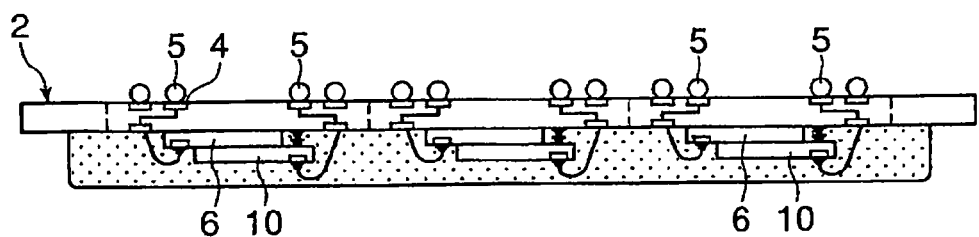

Thereafter, as illustrated in FIG. 3E, conductive balls made of solder or the like are mounted on lands 4 arranged on the other surface of the wiring substrate 2, thereby forming external terminals (bump electrodes) 5. In the ball mounting process, for example, using a non-illustrated sucking mechanism having a plurality of sucking holes formed so as to match the layout of the lands 4 on the wiring substrate 2, the balls made of solder or the like are held at the sucking holes, flux is transferred onto the held balls, and the balls are collectively mounted on the lands 4 of the wiring substrate 2. After the mounting of the balls, the external terminals 5 are formed by reflow.

Figure 3F:
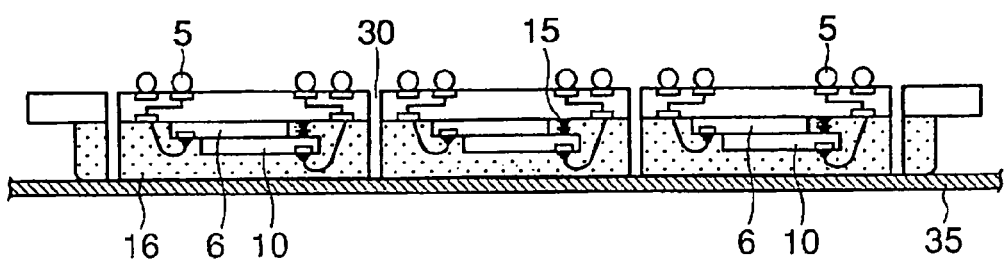

As illustrated in FIG. 3F, the wiring substrate 2 formed with the external terminals 5 is cut and separated into pieces along dicing lines 30. The substrate dicing is carried out by bonding the sealing body 16 on the wiring substrate 2 to a dicing tape 35 to thereby support the wiring substrate 2 by the dicing tape 35 and then vertically and horizontally cutting the wiring substrate 2 into pieces along the dicing lines 30 using a non-illustrated dicing blade. Then, by picking up the cut pieces from the dicing tape 35, there are obtained semiconductor devices each like the semiconductor device 1 illustrated in FIG. 1.

Second Exemplary Embodiment

Figure 4:
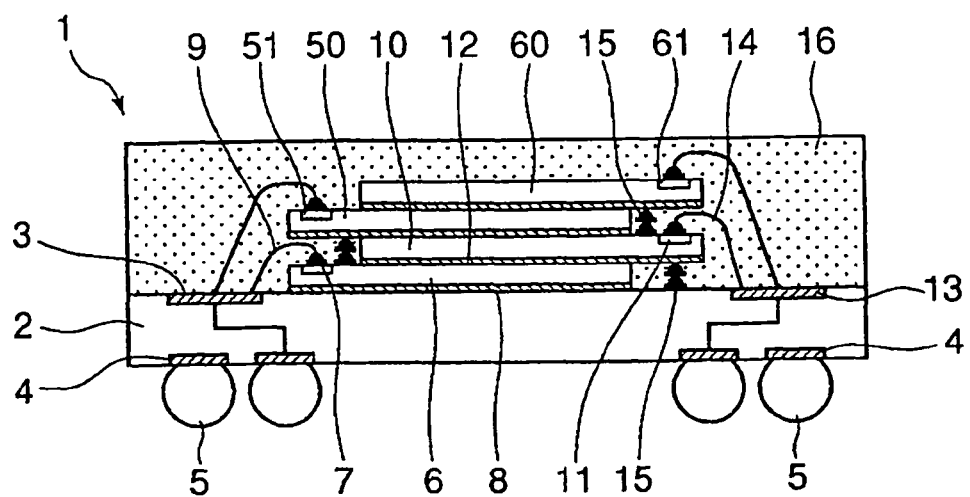
FIG. 4 is a sectional view illustrating a semiconductor device of a second exemplary embodiment according to this invention.
Figure 5:
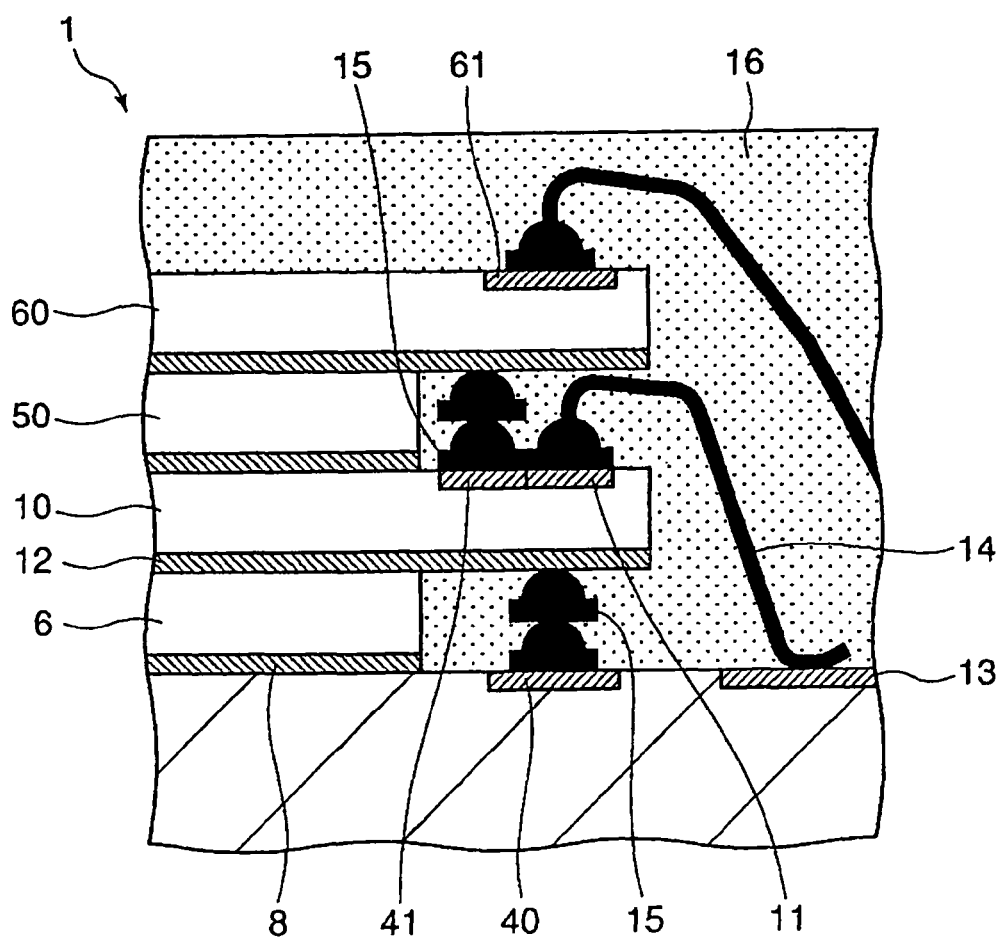
FIG. 5 is an enlarged view of the main part of the semiconductor device of the second exemplary embodiment according to this invention.

Referring now to FIGS. 4 and 5, a semiconductor device according to a second exemplary embodiment of this invention will be described. Herein, a description about the same portion as the semiconductor device 1 according to the first exemplary embodiment in which the semiconductor chips are stacked in two stages (see FIGS. 1 and 2) is omitted for convenience' sake.

In the second exemplary embodiment, this invention is applied to semiconductor chips that are multi-stage stacked in three or more stages. Specifically, on a second semiconductor chip 10 stacked on a first semiconductor chip 6, a third semiconductor chip 50 and a fourth semiconductor chip 60 are further stacked.

As illustrated in FIGS. 4 and 5, by providing support members 15 on a wiring substrate 2 and the lower-side semiconductor chips (herein, the semiconductor chips 6, 10, and 50), it is possible to satisfactorily carry out wire bonding for the semiconductor chips 6, 10, 50, and 60 that are multi-stage stacked in three or more stages. Further, by configuring that the support members 15 support protruding portions of the semiconductor chips 10, 50, and 60, the stacked structure can be stabilized. Herein, the support members 15 supporting the fourth semiconductor chip 60 are formed on connection pads 41 of the second semiconductor chip 10.

As illustrated in FIG. 4, by stacking the semiconductor chips 6, 10, 50, and 60, each formed with electrode pads 7, 11, 51, or 61 only at one side thereof, so as to be alternately offset from each other to expose the electrode pads 7, 11, 51, and 61, it is possible to reduce an area, where the semiconductor chips 6, 10, 50, and 60 are mounted, occupied on the wiring substrate 2 and thus to achieve the multi-stage stacking in three or more stages.

Third Exemplary Embodiment

Figure 6:
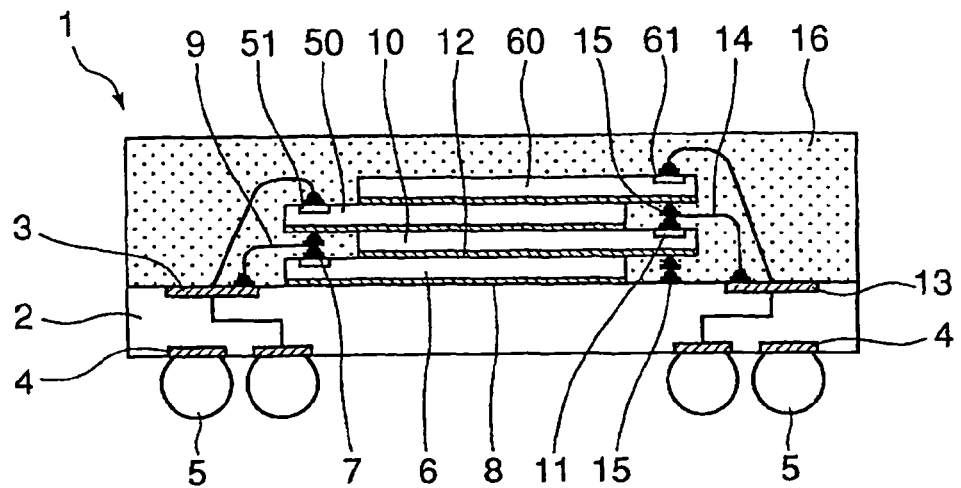
FIG. 6 is a sectional view illustrating a semiconductor device of a third exemplary embodiment according to this invention.
Figure 7:
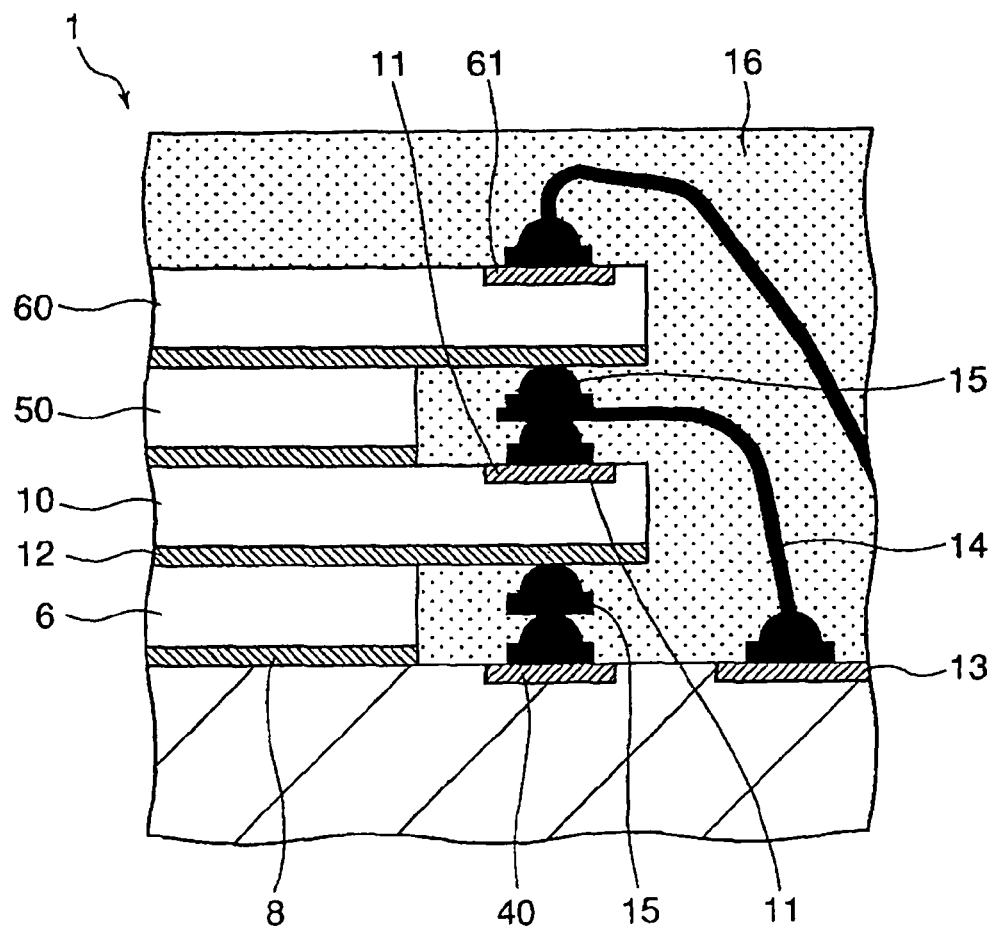
FIG. 7 is an enlarged view of the main part of the semiconductor device of the third exemplary embodiment according to this invention.

Referring now to FIGS. 6 and 7, a semiconductor device according to a third exemplary embodiment of this invention will be described. Herein, a description about the same portion as the semiconductor device 1 according to the second exemplary embodiment in which the semiconductor chips are stacked in four stages (see FIGS. 4 and 5) is omitted for convenience' sake.

In the third exemplary embodiment, as illustrated in FIG. 7, bumps as support members 15 provided on electrode pads 11 of a second semiconductor chip 10 are electrically connected to corresponding connection pads 13 of a wiring substrate 2 through conductive wires 14 by reverse bonding, respectively. Then, a bump of one more tier is further formed on each of the bumps with the wires 14 connected thereto, thereby supporting the back surface of a fourth semiconductor chip 60 further disposed thereabove. With this configuration, it is not necessary to newly provide connection pads for support members 15 and it is possible to satisfactorily carry out wire bonding for the upper-side semiconductor chip (herein, the fourth semiconductor chip 60).

While the invention made by the present inventor has been specifically described based on the embodiments, it is needless to say that this invention is not limited thereto and various changes can be made without departing from the scope and spirit of the invention.

Figure 8:
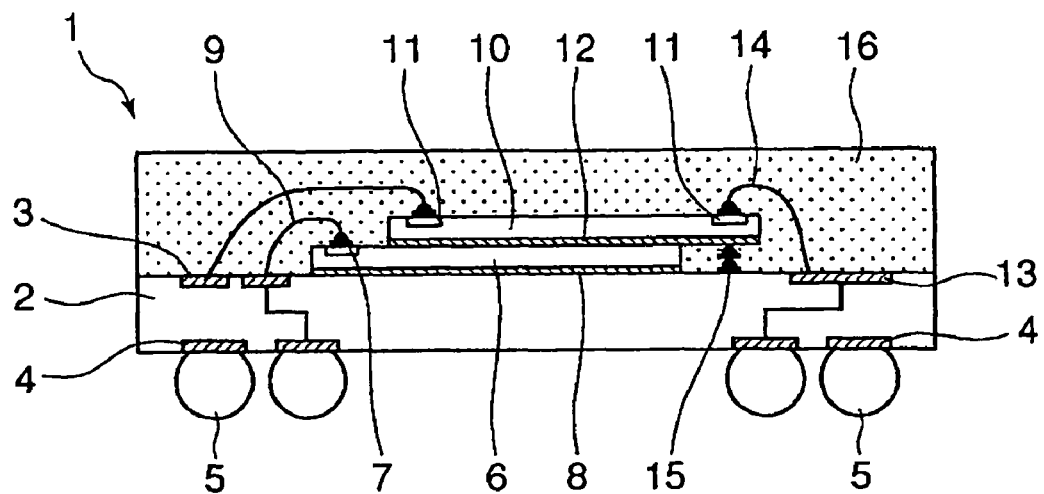
FIG. 8 is a sectional view illustrating a semiconductor device of another exemplary embodiment according to this invention.

For example, in the foregoing first embodiment, the description has been given of the case where the same semiconductor chips are stacked. However, any configuration may be employed as long as the lower side of the electrode pads 11 of the second semiconductor chip 10 is supported. For example, this invention is also applicable to the case where different types of semiconductor chips are stacked as illustrated in FIG. 8. In a semiconductor device 1 of FIG. 8, a plurality of electrode pads 11 are arranged at both sides of a second semiconductor chip 10.

Figure 9:
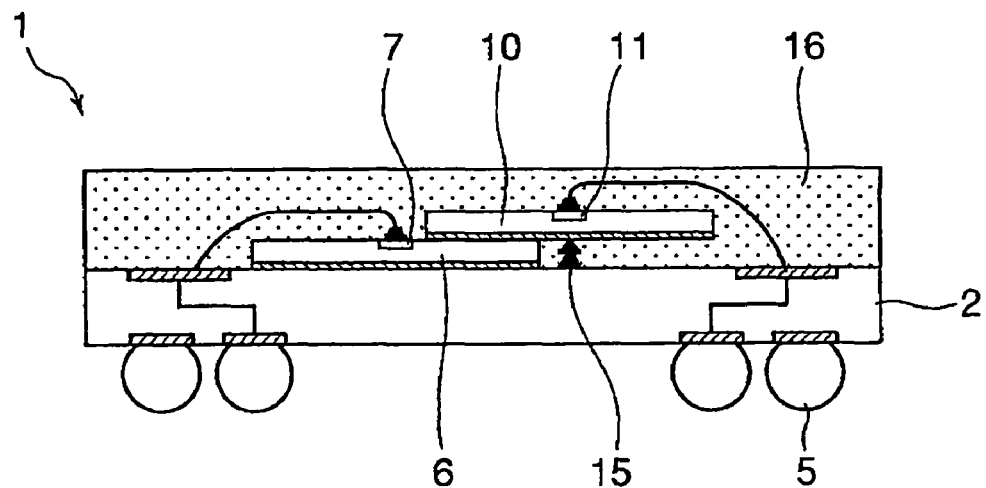
FIG. 9 is a sectional view illustrating a semiconductor device of another exemplary embodiment according to this invention.

Further, in the foregoing first exemplary embodiment, the description has been given of the case where use is made of the semiconductor chips each having the electrode pads 7 or 11 only at one side thereof. However, as illustrated in FIG. 9, use may be made of semiconductor chips 6 and 10 each having electrode pads 7 or 11 arranged only in the middle thereof.

Further, in the foregoing exemplary embodiments, the description has been given of the case where the glass epoxy substrate is used as the wiring substrate 2. However, use may be made of a tape-like wiring substrate made of a polyimide resin or the like.

Further, in the foregoing exemplary embodiments, the description has been given of the case where this invention is applied to the BGA-type semiconductor device. However, this invention is also applicable to a semiconductor device having a stacked structure of LGA (Land Grid Array) or MCP (Multi-Chip Package) semiconductor chips or the like.

According to the foregoing exemplary embodiments, the electrode pads of the upper-side semiconductor chip are disposed at the positions not overlapping with the lower-side semiconductor chip and the circular cylindrical or conical support members are provided to support, through the insulating member, the other surface of the upper-side semiconductor chip at its portions corresponding to the electrode pads. Therefore, thin semiconductor chips can be properly stacked in a plurality of stages and wire-bonded without occurrence of a chip crack.

Further, since the insulating member serves as a buffering member, there is no direct contact between the semiconductor chip and the support members and, therefore, it is possible to reduce occurrence of a chip crack caused by contact between the semiconductor chip and the support members. This makes it possible to improve the manufacturing yield.

Further, by configuring that the protruding portions of the semiconductor chips stacked in multi-stages are supported by the support members on the wiring substrate and the semiconductor chip mounted on the wiring substrate, the multi-stage stacked structure can be stabilized. Further, it is possible to satisfactorily achieve stacking of the semiconductor chips in three or more stages without increasing the package size.

It is apparent that the present invention is not limited to the above embodiments, but may be modified and changed without departing the scope and sprit of the invention.

What is claimed is:

1. A semiconductor device, comprising:
a first semiconductor chip stacked on a wiring substrate and having first electrode pads disposed at predetermined positions on an upper surface thereof;
a second semiconductor chip having second electrode pads disposed at predetermined positions on an upper surface thereof, and stacked on the first semiconductor chip through an insulating member in an offset manner so that the first electrode pads are exposed the second electrode pads being arranged on an upper surface of a protruding portion of the second semiconductor chip; and
support members supporting a back surface of the protruding portion of the second semiconductor chip through the insulating member.

2. The semiconductor device according to claim 1, wherein the support members respectively support the back surface of the protruding portion of the second semiconductor chip at portions corresponding to the second electrode pads at a predetermined interval.

3. The semiconductor device according to claim 1, wherein the support members respectively support the back surface of the protruding portion of the second semiconductor chip at portions between the second electrode pads.

4. The semiconductor device according to claim 1, wherein the insulating member is a bonding member having an adhesive layer on each of both surfaces of an insulating sheet member.

5. The semiconductor device according to claim 1, wherein the support members each have a circular cylinder shape or a circular cone shape.

6. The semiconductor device according to claim 5, wherein the support members are each in the form of bumps stacked in two tiers.

7. A semiconductor device, comprising:
a first semiconductor chip stacked on a wiring substrate and having first electrode pads disposed at predetermined positions on an upper surface thereof;

a second semiconductor chip stacked on the first semiconductor chip through an insulating member in an offset manner so that the first electrode pads are exposed; and support members supporting a back surface of a protruding portion of the second semiconductor chip through the insulating member, wherein the first electrode pads are disposed on the upper surface of the first semiconductor chip along a first side, second electrode pads are disposed on an upper surface of the second semiconductor chip along a second side opposite to the first side, and the support members respectively support the back surface of the protruding portion of the second semiconductor chip at portions corresponding to the second electrode pads.

8. The semiconductor device according to claim 7, wherein the support members each have a circular cylinder shape or a circular cone shape.

9. The semiconductor device according to claim 7, wherein a size of the second semiconductor chip is the same as a size of the first semiconductor chip.

10. A semiconductor device having semiconductor chips stacked in three or more stages on a wiring substrate, wherein electrode pads are disposed on upper surfaces of the semiconductor chips, the semiconductor chips are stacked so as to be alternately offset from each other to expose the electrode pads, insulating members are disposed in entire areas on back surfaces of the semiconductor chips, and support members are provided to support back surfaces of protruding portions of the semiconductor chips through the insulating members, respectively.

11. The semiconductor device according to claim 10, wherein the semiconductor chips have the same chip size.

12. The semiconductor device according to claim 10, wherein the support members are each formed by electrically connecting a connection pad of the wiring substrate to a first bump, provided on the predetermined electrode pad of the semiconductor chip, through a conductive wire by reverse bonding, and then forming a second bump on the first bump with the conductive wire connected thereto.

13. The semiconductor device according to claim 10, wherein the insulating member is a bonding member having an adhesive layer on each of both surfaces of an insulating sheet member.

14. The semiconductor device according to claim 10, wherein the support members each have a circular cylinder shape or a circular cone shape.

15. A semiconductor device manufacturing method, comprising:

preparing a first semiconductor chip having first electrode pads at predetermined positions on an upper surface;

stacking the first semiconductor chip on a wiring substrate;

forming supporting members on the wiring substrate;

stacking a second semiconductor chip on the first semiconductor chip and the supporting members through an insulating member so that the first electrode pads are exposed, and a protruding portion of the second semiconductor chip being supported by the supporting member; and covering at least the first and the second semiconductor chips with a sealing body.

16. The semiconductor device manufacturing method according to claim 15, wherein the first electrode pads are disposed on the upper surface of the first semiconductor chip along a first side, second electrode pads are disposed on an upper surface of the second semiconductor chip along a second side opposite to the first side, and the support members respectively support the back surface of said protruding portion of the second semiconductor chip at portions corresponding to the second electrode pads.

17. The semiconductor device manufacturing method according to claim 15, wherein the insulating member is a bonding member having an adhesive layer on each of both surfaces of an insulating sheet member.

18. The semiconductor device manufacturing method according to claim 15, wherein the support members each have a circular cylinder shape or a circular cone shape.

19. The semiconductor device manufacturing method according to claim 18, wherein the support members are each in the form of bumps stacked in two tiers.

* * * * *